United States Patent
Ishikura et al.

[11] Patent Number: 6,025,211
[45] Date of Patent: Feb. 15, 2000

[54] HYDROGEN-TERMINATED DIAMOND MISFET AND ITS MANUFACTURING METHOD

[75] Inventors: Takefumi Ishikura; Satoshi Yamashita, both of Tokyo; Hiroshi Kawarada, Yokohama; Akira Hokazono, Higashimurayama, all of Japan

[73] Assignee: Tokyo Gas Co., Ltd., Tokyo, Japan

[21] Appl. No.: 09/158,066

[22] Filed: Sep. 22, 1998

Related U.S. Application Data

[62] Division of application No. 08/919,792, Aug. 29, 1997, Pat. No. 5,854,496.

[30] Foreign Application Priority Data

Sep. 2, 1996 [JP] Japan ..................... 8-232189
Aug. 12, 1997 [JP] Japan ..................... 9-217679

[51] Int. Cl.⁷ ......................... H01L 21/336
[52] U.S. Cl. ............. 438/105; 438/149; 438/151; 438/404
[58] Field of Search ................ 438/105, 149, 438/151, 404, 967; 257/76, 77, 629

[56] References Cited

U.S. PATENT DOCUMENTS 5,107,315 4/1992 Kumagai et al. .
5,455,432 10/1995 Hartsell et al. .
5,500,393 3/1996 Nishibayashi et al. .

FOREIGN PATENT DOCUMENTS 0 702 403 3/1996 European Pat. Off. .
08139109A 5/1996 Japan .

OTHER PUBLICATIONS

T Maki et al., "Hydrogenating effect os single-crystal diamond surface"; JJAP, part 2, vol. 31, No. 10A, pp. 1446–1449, Oct. 1992.

Hiroshi Kawarada et al.; "Enhancement Mode Metal–Semiconductor Field Effect Transistors Using Homoepitaxial Diamonds", Applied Physics Letters, vol. 65, No. 12, Sep. 19, 1994, pp. 1563–1565.

Hideo Kiyota et al.; "Fabrication of Metal–Insulator–Semiconductor Devices Using Polycrystalline Diamond Film", Japanese Journal of Applied Physics, vol. 30, No. 12A, Part 2, Dec. 1, 1991, pp. L2015–L2017.

Primary Examiner—Charles Bowers
Assistant Examiner—Keith Christianson
Attorney, Agent, or Firm—Armstrong, Westerman, Hattori, McLeland & Naughton

[57] ABSTRACT

On the surface of a hydrogen-terminated diamond 1 formed by terminating a surface 2 of either a homoepitaxial diamond or a heteroepitaxial diamond or a surface-flattened polycrystal diamond are formed a drain-ohmic contact 4 and a source-ohmic contact 3 of gold or platinum, an insulating layer 5 formed of silicon oxide ($SiO_x$: $1 \leq X \leq 2$) and a gate electrode 6 mounted on said insulating layer, and the surface other than the element forming region is set to be an insulating region being non-hydrogen-terminated, for example, oxygen-terminated, and the elements formed on said region is being isolated.

24 Claims, 12 Drawing Sheets

HYDROGEN-TERMINATED DIAMOND MISFET AND ITS MANUFACTURING METHOD

This application is a division of prior application Ser. No. 08/919,792 filed Aug. 29, 1997 now U.S. Pat. No. 5,854,496.

TECHNICAL FIELD OF THE INVENTION

The present invention relates to a MISFET using hydrogen-terminated diamond, and to a MISFET using hydrogen-terminated diamond having elements insulated from each other, and to a method for fabricating the MISFET using hydrogen-terminated diamond.

Further, the present invention relates to a polycrystal diamond MISFET having a flattened hydrogen-terminated surface.

BACKGROUND OF THE INVENTION

Conventional diamond FETs are fabricated using a p-type semiconductor layer made by doping boron atoms (B) into a diamond layer (K. Kobashi, K. Nishimura, K. Miyata, R. Nakamura, H. Koyama, K. Saito and D.L. Dreifus: Proc. $2^{nd}$ Int. Conf., Appl. Of Diamond Films and Related Materials., ed. M. Yoshikawa, M. Murakawa, Y. Tzeng and W. A. Yarbrough, pp 35–42 (Saitama, 1993)).

Figure 10:
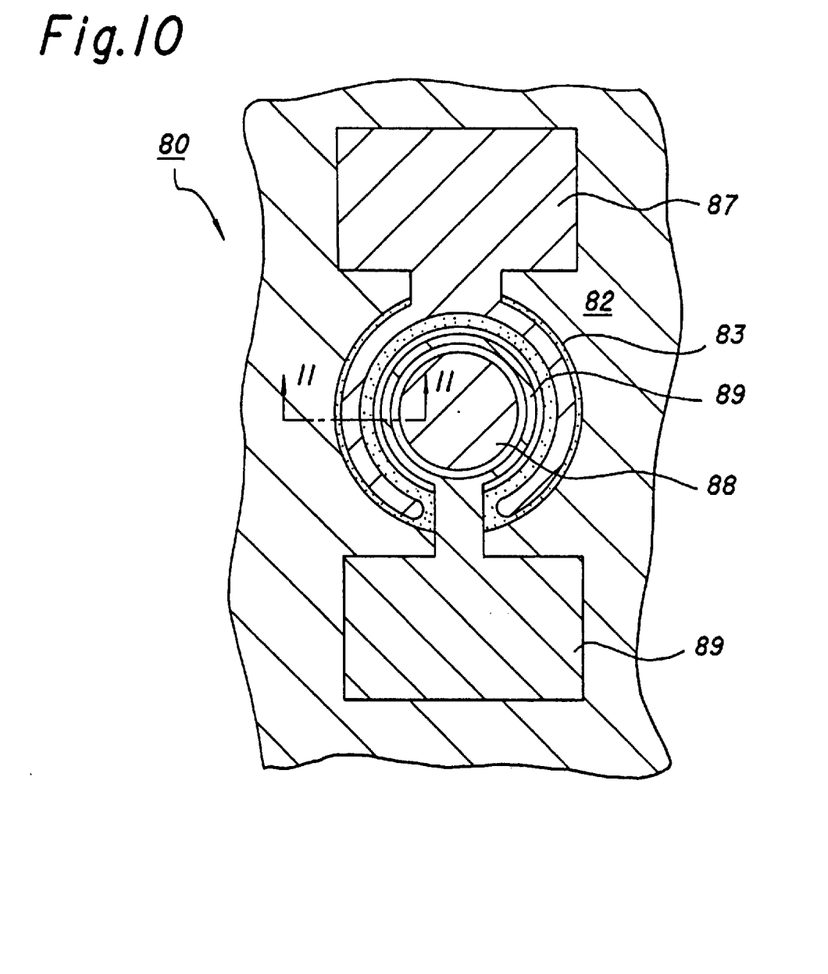
FIG. 10 is a plan view showing the structure of the diamond semiconductor device of the prior art.
Figure 11:
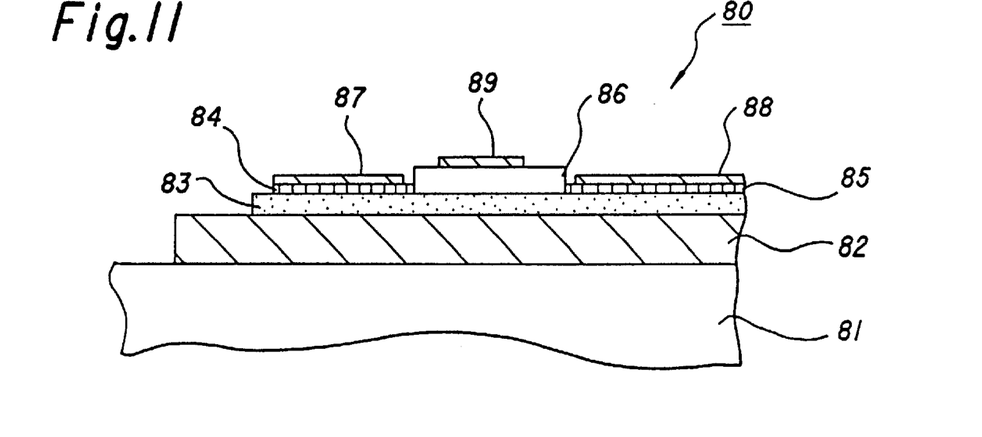
FIG. 11 is a cross-sectional view showing the structure of the diamond semiconductor device of the prior art.

FIG. 10 is a schematic plan view of a conventional FET mentioned above, and FIG. 11 is a fragmentary cross-sectional view taken along the B—B line of FIG. 10. FET 80 is made by first depositing a diamond layer 82 on a substrate 81 with no impurity doped and a boron-doped layer 83 on the diamond layer 82, then making an annular $p^+$ region 84, a circular $p^+$ region 85 concentric with the annular region 84 and an annular non-doped region 86 between the annular region 84 and the circular region 85, further making a source ohmic contact 87, a drain ohmic contact 88 or a gate electrode 89 on the respective regions. That is, this FET requires a circular geometry of elements as shown in FIG. 10 to prevent leakage of a current to the exterior, and does not suit for microminiaturization or for integration of such elements with a high density.

In regard of Si semiconductors, LOCOS technique is used as an element insulating technique for insulating and isolating elements from each other by providing an oxide layer as shown in, for example, Japanese Patent Publication S49-45629. The LOCOS technique, however, cannot be used for diamond semiconductor devices because diamond itself is not readily oxidized thick enough to form an oxide film on the surface of the diamond. An alternative approach for isolating elements on a diamond semiconductor device selectively removes semiconductor regions by etching, etc. to isolate respective elements on a diamond substrate as taught in, for example, "Diamond Thin-Film Recessed Gate Field-Effect Transistors Fabricated by Electron Cyclotron Resonance Plasma Etching: S. A. Grot, G. S. Gildenblat, and A. R. Badzian, IEEE ELECTRON DEVICE LETT. VOL 13 No.9, September 1992, pp 462–463". This approach, however, requires complicated processes including etching.

The present inventors formerly proposed at Applied Physics Conference a method for fabricating MESFET including a source ohmic contact and a drain ohmic contact made by vapor deposition of aluminum (Aoki, Ito, Kawarada, et al.: Brief of $40^{th}$ Joint Meeting Related to Applied Physics, p. 30, M11, 12). This method certainly provides MESFETs having a simple structure and operative in an enhanced mode; however, since a surface conductive layer is formed directly under the hydrogen-terminated surface of the homoepitaxial diamond, even this method failed to insulate respective elements, and could not integrate a plurality of semiconductor elements on a common substrate.

In order to solve this problem, the present applicant filed a patent application regarding the invention to isolate elements in a hydrogen-terminated diamond semiconductor device (Japanese Patent Application No. H7-64035, Japanese Patent Laid-Open No. H8-139109). This invention relates to a hydrogen-terminated diamond semiconductor device having isolated elements comprising a hydrogen-terminated region and a non-hydrogen-terminated region on the diamond surface, mounting a semiconductor element on the hydrogen-terminated region, and further relates to an enhancement-type MESFET.

However, when forming an inverter circuit using an enhancement-type MESFET as a load, it will not work as a load when the gate and the source is connected, because the current will not flow at Vgs=0 V. Therefore, when the circuit having an EE (enhancement enhancement) structure wherein two enhancement-type MESFETs are connected in series, the drain and the gate is connected regarding the load, but the output voltage will reduce by the threshold voltage, lowering the utilization ratio of the power source. Therefore, it was necessary to operate it with higher power source voltage.

The present invention is aimed at providing a MISFET formed on the surface of a hydrogen-terminated diamond.

Further, the present invention is aimed at providing a simple method of manufacturing a semiconductor device wherein each element formed on the surface of the same hydrogen-terminated homoepitaxial diamond substrate with a reduced number of mask processing.

The further object of the present invention is to provide a hydrogen-terminated diamond MISFET providing an FET having any mode of the depletion mode or the enhancement mode.

SUMMARY OF THE INVENTION

The present invention formed the hydrogen-terminated diamond MISFET mounting a drain and a source on a hydrogen-terminated region of the surface of the diamond, and a gate electrode between the drain and the source on an insulating layer.

Further, the present invention formed the above-mentioned hydrogen-terminated diamond MISFET wherein the diamond is formed by a homoepitaxial diamond or a heteroepitaxial diamond or a polycrystal diamond with a flattened surface, the insulated layer is formed by a silicon oxide shown by the chemical formula ($SiO_x$: $1 \leq X \leq 2$).

Further, the above-mentioned hydrogen-terminated diamond MISFET of the present invention formed the source electrode or the drain electrode by an ohmic contact of gold or platinum.

Further, the above-mentioned hydrogen-terminated diamond MISFET divided the surface of said diamond into a hydrogen-terminated region and a non-hydrogen-terminated insulated region, and formed a FET on the hydrogen-terminated region, and isolating the elements.

Further, the above-mentioned hydrogen-terminated diamond MISFET of the present invention gains the non-hydrogen-terminated region by displacing the oxygen on the surface of the hydrogen-terminated diamond by an oxygen plasma processing, or irradiating argon ions to the surface of the hydrogen-terminated diamond.

The present invention, on manufacturing said hydrogen-terminated diamond MISFET, forms a source electrode and a drain electrode by etching the metal layer formed on the hydrogen-terminated diamond surface, and then forms a resist on the region for forming FET elements, and the hydrogen-terminated diamond regions being left are provided with a non-hydrogen termination processing to form a non-hydrogen-terminated region thereto, and then forming an insulating layer to the hydrogen-terminated region, forming a gate electrode on said insulating layer.

In the manufacturing method of said hydrogen-terminated diamond MISFET of the present invention, the diamond is formed by a homoepitaxial diamond, a heteroepitaxial diamond or a polycrystal diamond having a flattened surface, and formed the insulating layer by a silicon oxide shown by the chemical formula ($SiO_x$: $1 \leq X \leq 2$).

Further, in the manufacturing method of said hydrogen-terminated diamond MISFET of the present invention, the source electrode or the drain electrode is formed by an ohmic contact of gold or platinum.

In the manufacturing method of said hydrogen-terminated diamond MISFET of the present invention, either an oxygen plasma processing is performed to the surface of said hydrogen-terminated diamond for displacement of the oxygen or argon ions are irradiated to the surface of said hydrogen-terminated diamond in order to gain a non-hydrogen termination.

DETAILED DESCRIPTION

Figure 1:
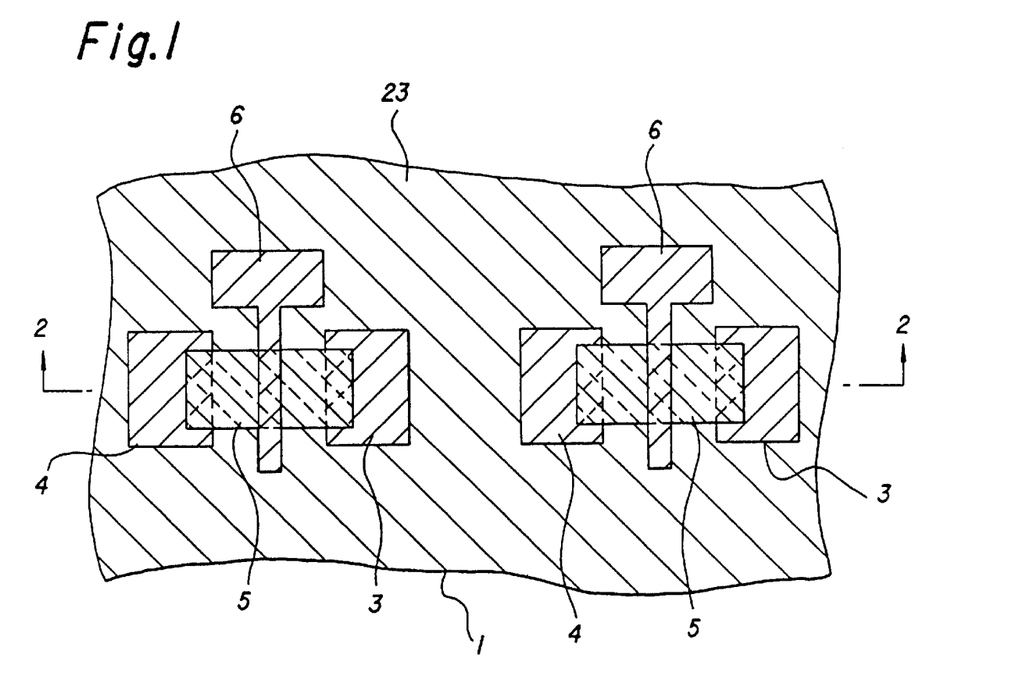
FIG. 1 is a plan view showing the structure of the hydrogen-terminated diamond MISFET according to the present invention.
Figure 2:
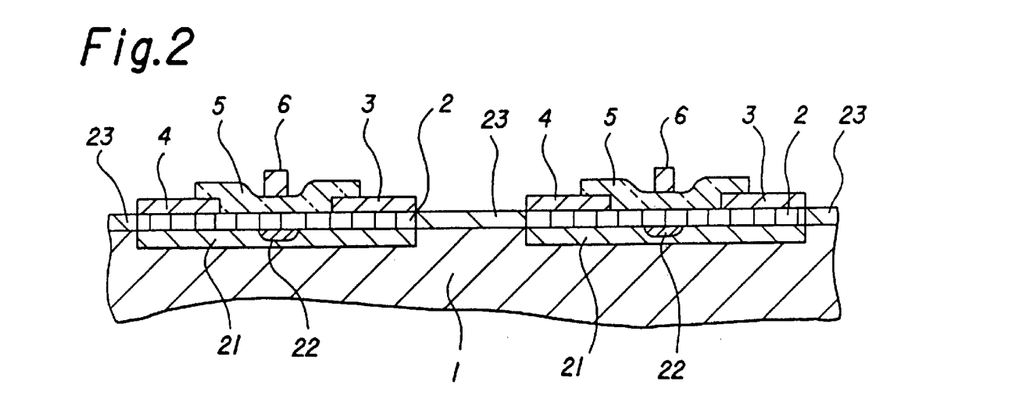
FIG. 2 is a cross-sectional view showing the structure of the hydrogen-terminated diamond MISFET according to the present invention.

FIG. 1 schematically shows a semiconductor device including a plurality of MISFETs on a surface of a homoepitaxial diamond film, taken as an embodiment of the invention, and FIG. 2 is a cross-sectional view taken along the A—A line of FIG. 1.

As shown in FIG. 1, the MISFET of the present invention comprises a homoepitaxial diamond film 1 prepared by epitaxially growing monocrystalline diamond on a diamond plate by a microwave plasma process, then making hydrogen-terminated regions 2 and a non-hydrogen-terminated region 23 on a surface of the hydrogen-terminated homoepitaxial diamond film 1, and making on each hydrogen-terminated region 2 a drain electrode contact 3 and a source electrode contact 4 by vapor deposition of gold which makes an ohmic contact, an insulating layer 5, and a gate electrode 6 mounted on said insulating layer.

Formed under each hydrogen-terminated region 2 is a p-type semiconductor layer 21 as shown in FIG. 2. By impressing voltage to the gate electrode, a stopping region 22 is produced in the p-type semiconductor layer 21 located under the gate electrode. The stopping region 22 is formed by impressing a gate voltage, so the MISFET is depletion operated. Since the surface conductive layer comprising the p-type semiconductor layer 21 is as thin as 100 Å to hundreds of Å, the stopping region can be formed easily. Therefore, a depletion-type MISFET having the gate between the drain and the source is formed. On the other hand, insulation is established along the non-hydrogen-terminated region 23 and the lower surface thereof, and the insulating region isolates each semiconductor element from others.

The term "hydrogen-termination" used in the present invention pertains to a status of a diamond crystal terminated by coupling hydrogen atoms with dangling bonds, i.e. unoccupied bonds, of carbon atoms in the surface layer of the diamond crystal grown. For example, by depositing a diamond film in the presence of hydrogen atoms, a hydrogen-terminated homoepitaxial diamond film can be obtained. The term "non-hydrogen-termination" pertains to a status of the diamond crystal with its surface terminated by atoms other than hydrogen atoms. For example, by processing the surface of hydrogen-terminated diamond with oxygen plasma, oxygen-terminated regions can be obtained.

Figure 3:
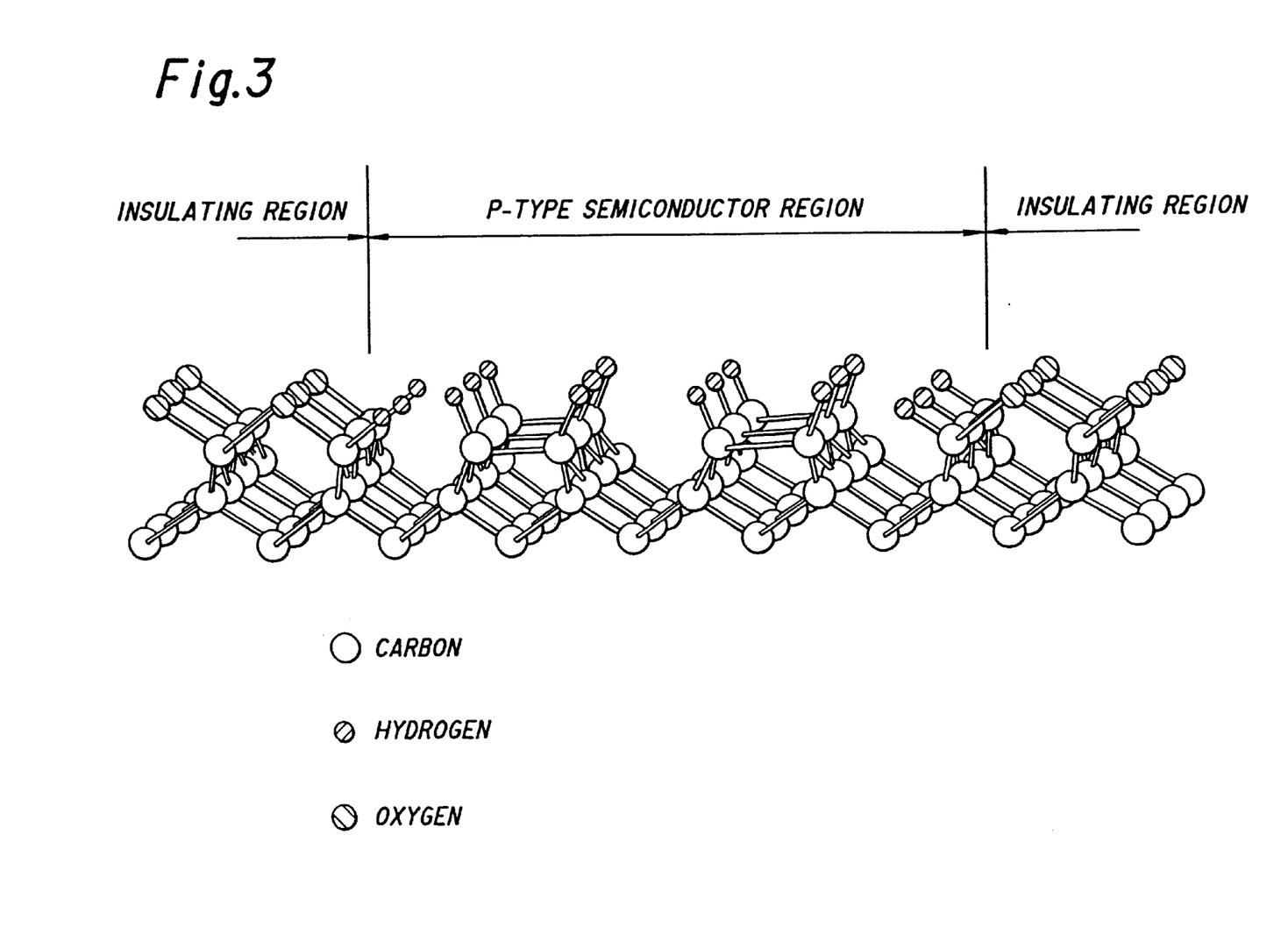
FIG. 3 is a concept view showing the structure of the termination of the diamond.

FIG. 3 shows terminal structures of a hydrogen-terminated region and oxygen-terminated regions. The surface layer of a carbon crystal in each hydrogen-terminated region is terminated by hydrogen atoms, and those in the non-hydrogen-terminated regions are terminated by oxygen atoms.

Shown below are specific conditions employed to fabricate hydrogen-terminated homoepitaxial diamond used in the invention. Namely, diamond single crystal was epitaxially grown by heating a diamond substrate to 850° C., introducing a mixed gas with 10% of carbon oxide gas (CO) in hydrogen gas ($H_2$) as the material gas, and applying the pressure of 35 Torr. Also usable as the material gas in lieu of this example are various kinds of hydrocarbon such as methane, thane, butane, and ethylene.

Although diamond is an insulator at room temperature, p-type semiconductor regions can be made by hydrogen-terminating a diamond surface. Methods for hydrogen-terminating the surface of diamond include, for example, a method of processing a diamond surface with hydrogen plasma ($H_2$ plasma), and a method of introducing hydrogen gas as the atmosphere in a reaction vessel after composing diamond by CVD, etc. On the other hand, when the surface of diamond is non-hydrogen-terminated (oxygen-terminated) by applying oxygen plasma ($O_2$ plasma) onto the diamond surface, exposing a diamond surface to air (oxygen) after being composed, or by irradiating argon ions onto the diamond surface, an insulating region can be made on the diamond surface. By localizing two different regions, i.e. semiconductor regions and insulating regions, in these manners, a plurality of hydrogen-terminated insulated diamond semiconductor elements can be made on a common diamond substrate.

The present invention enables to manufacture a hydrogen-terminated diamond MISFET by forming an insulating layer on the surface of a hydrogen-terminated diamond without damaging the hydrogen-terminated surface.

By using such insulating layer, the diamond MISFET of the present invention can reduce current leakage, and has greatly improved temperature characters compared to the prior art diamond MESFET. Further, the diamond MISFET of the present invention is of a depletion mode, but can also be changed of its mode by controlling the insulating layer thickness.

That is, by the existence of the insulating layer, the gate voltage decreases compared to the MES interface, which reduces the widening of the hole layer and makes it easier to change the mode to depletion mode.

Therefore, when the insulating layer is reduced of its thickness, the characters shown becomes closer to the characteristics shown by MESFET, and when utilizing metal of large Schottky barrier such as aluminum (Al) is used as the material for the gate electrode, the diamond MISFET can change from the depletion mode to an enhancement mode.

Embodiments

Figure 4A:
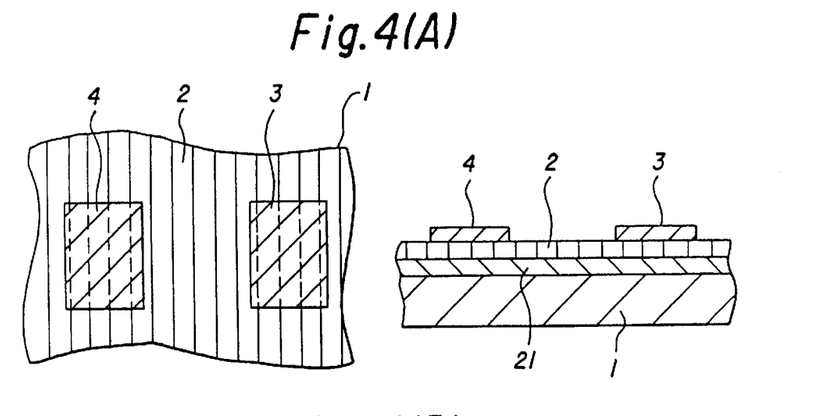
FIGS. 4a–4c is an explanatory view showing the manufacturing steps of the hydrogen-terminated diamond MISFET of the present invention.
Figure 4B:
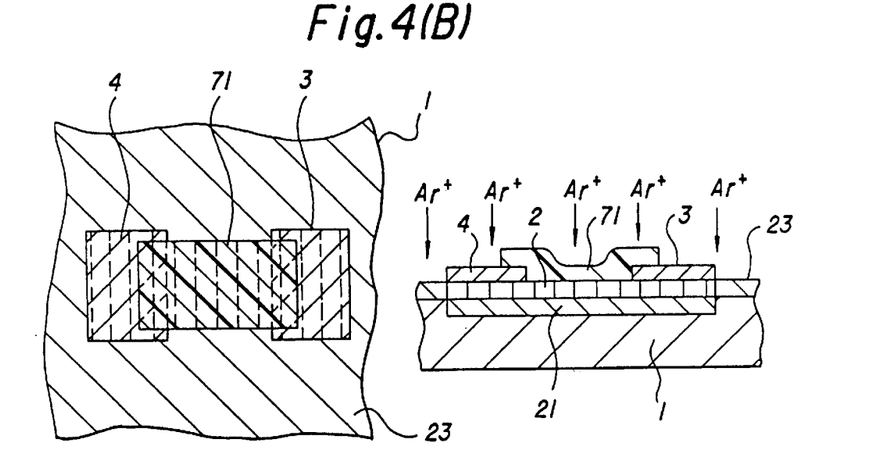
Figure 4C:
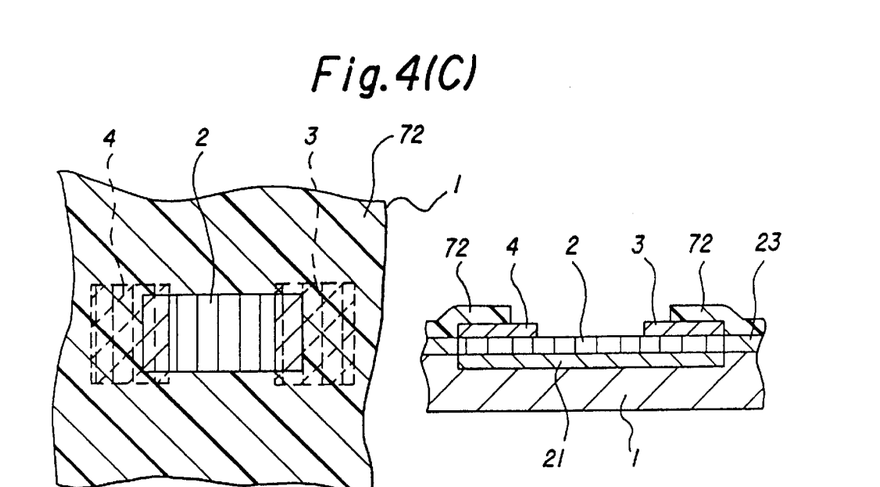
Figure 5A:
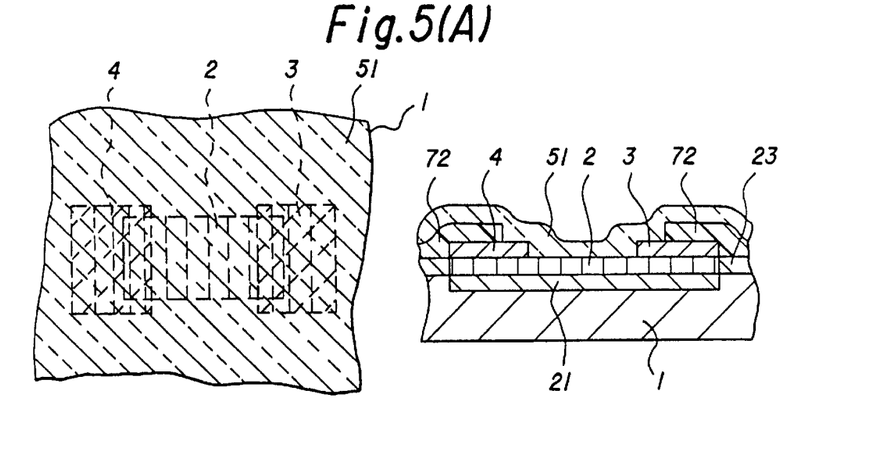
FIGS. 5a–5c is an continuous explanatory view showing the manufacturing steps of the hydrogen-terminated diamond MISFET of the present invention.
Figure 5B:
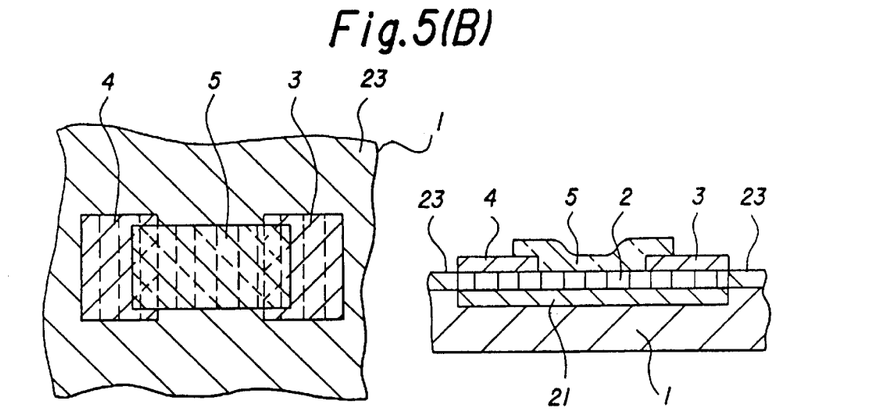
Figure 5C:
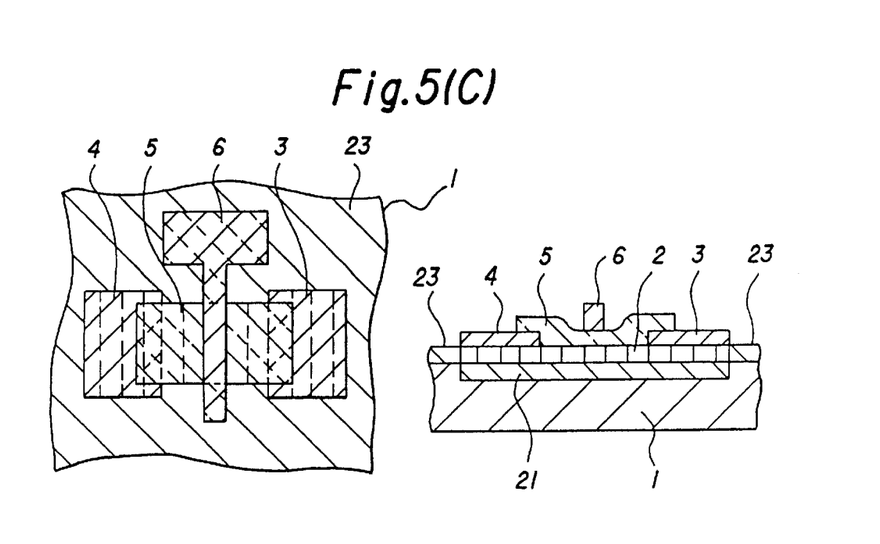

With reference to FIG. 4 and FIG. 5, the method for making the diamond MISFET of the present invention will be explained. In the drawing, the left figures show a plan view and the right figures show a cross-sectional view. In the present specification, the regions under the surface layer are shown by broken lines in the plan view.

A diamond substrate is put in a plasma CVD apparatus using microwaves as its exciting source. Introduced into the plasma CVD apparatus is a mixed gas containing hydrogen ($H_2$) and a carbon-supplying gas such as methane ($CH_4$), ethane ($C_2H_6$), butane ($C_4H_{10}$), ethylene ($C_2H_4$), carbon oxide (CO) and carbon dioxide ($CO_2$). The mixed gas is excited into plasma by microwaves, and diamond crystal is epitaxially grown on the surface of the diamond substrate to form a homoepitaxial diamond film 1.

After that, the substrate is rapidly cooled in the presence of hydrogen gas, such that hydrogen atoms bond to dangling bonds of carbon atoms in the surface layer of the diamond crystal to form the hydrogen-terminated surface 2. Thus obtained is a hydrogen-terminated homoepitaxial diamond substrate 1 having a surface conductive layer 21.

Gold, for example, is deposited to the surface of said hydrogen-terminated homoepitaxial diamond substrate I by evaporation to form a conductive layer, and then resist is applied thereto for patterning process. After that, the gold is etched to form a source electrode (ohmic contact) 3 and a drain electrode (ohmic contact) 4 (FIG. 4 (A)).

After the resist is patterned to the region for forming the electrodes to form a mask 71, the surface is irradiated with argon ions to provide damage to the hydrogen-terminated region 2 other than the areas being covered by the source electrode 3, the drain electrode 4 and the resist 71 in order to gain a non-hydrogen-terminated region 23. Under the non-hydrogen-terminated region 23 shows insulating characters with the p-type semiconductor layer being extinct (FIG. 4 (B)).

After that, the mask 71 is removed to further apply resist and then patterning it to form a mask 72 to the region other than the element forming region (FIG. 4 (C)).

Then, silicon oxide (SiO) is deposited by evaporation using resist heat evaporation device, forming a silicon oxide layer 51 shown by a chemical formula $SiO_x$ (provided $1 \leq X \leq 2$) (FIG. 5 (A)).

Next, the mask 72 is removed to lift off the silicon oxide layer 51 formed other than the element forming region, and insulating layer 5 is formed on the element forming region (FIG. 5 (B)).

After that, a mask having an opening in the shape of the gate electrode is formed on top, depositing the gate electrode by gold and the like using evaporation method, and then the mask is removed to form the gate electrode 6, and then a plurality of MISFETs are formed on the same substrate with each element being isolated from each other (FIG. 5 (C)).

Figure 6:
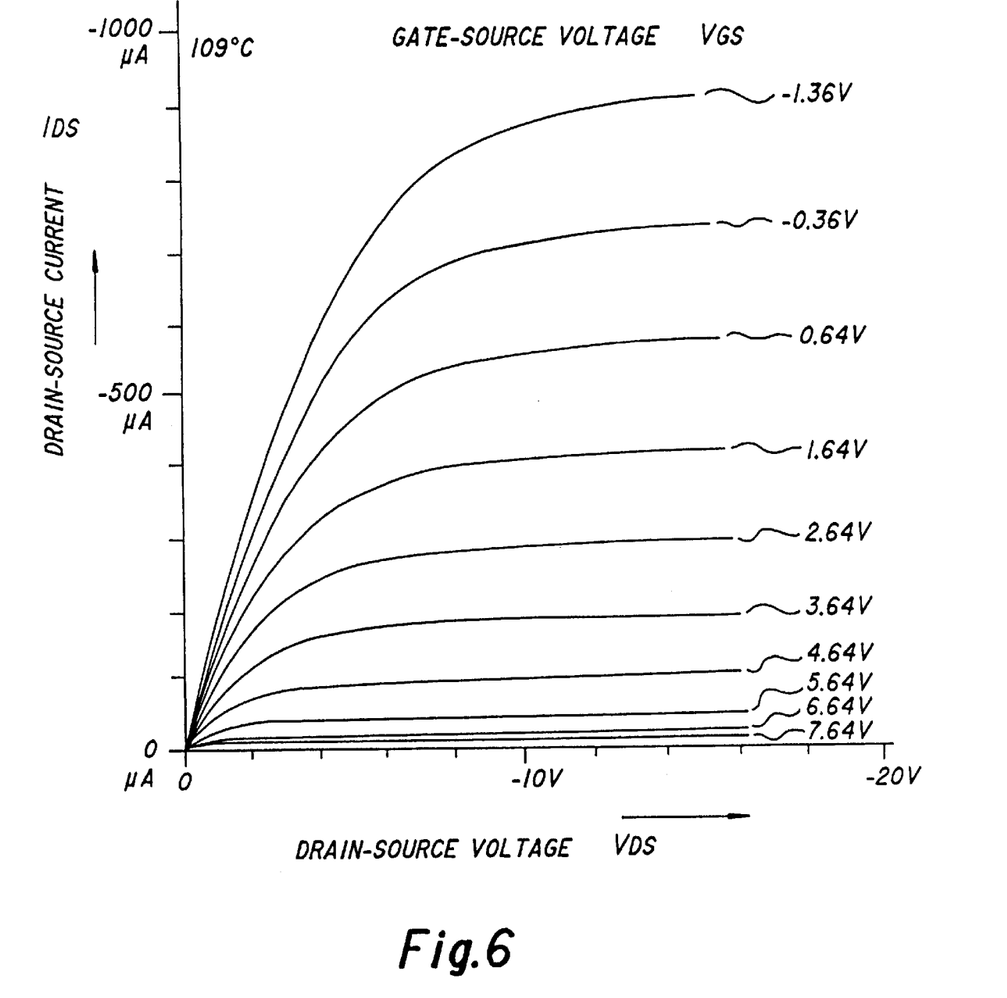
FIG. 6 is an explanatory view showing the characteristics of the hydrogen-terminated diamond MISFET of the present invention.
Figure 7:
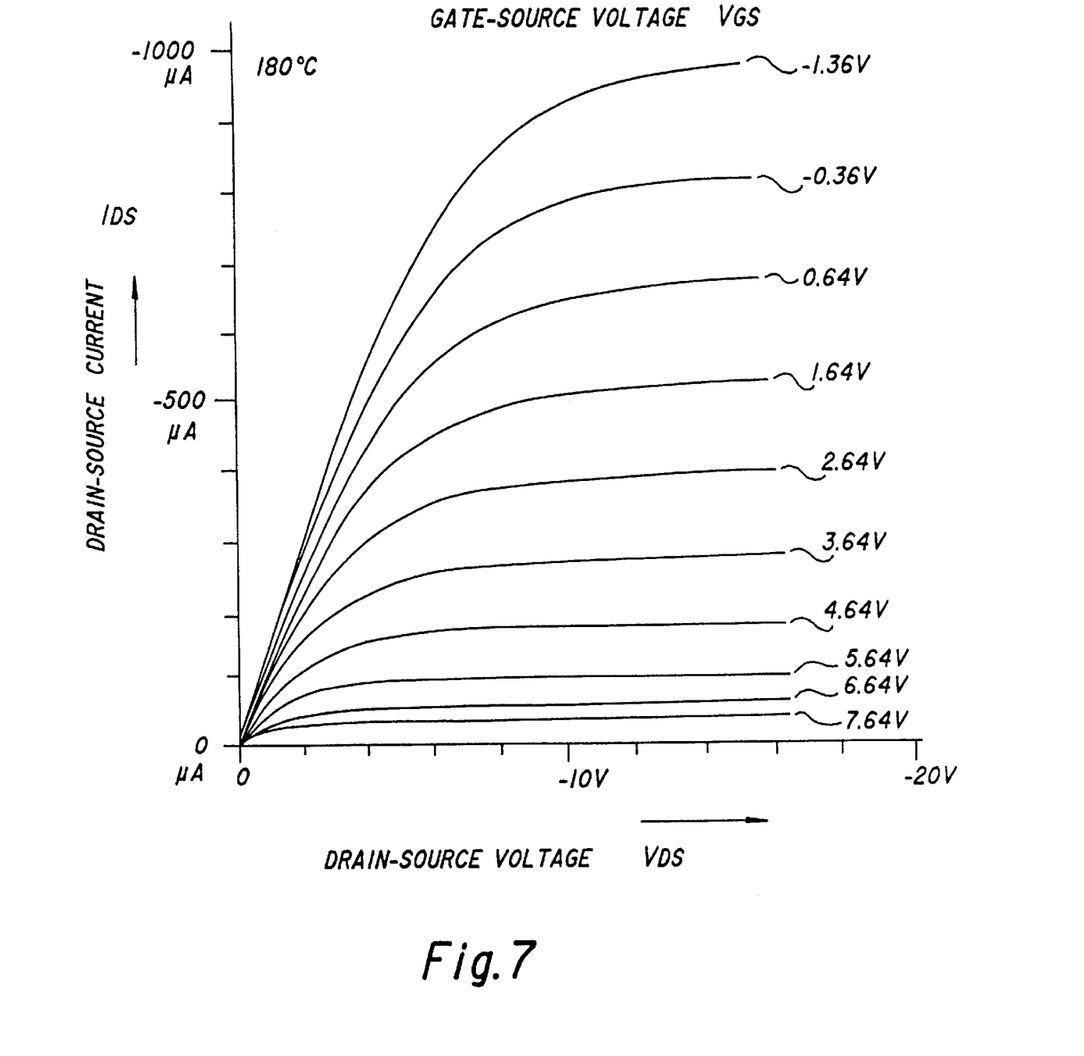
FIG. 7 is an explanatory view showing the characteristics of the hydrogen-terminated diamond MISFET of the present invention.

The characteristics of the diamond MISFET gained by the above embodiment will be explained below referring to FIG. 6 and FIG. 7. FIG. 6 shows the voltage-current characteristic at 109° C., and FIG. 7 shows the voltage-current characteristic at 180° C.

The MISFET used in the present embodiment is formed by irradiating argon (Ar+) ions for isolation of the plurality of MISFETs formed on the hydrogen-terminated diamond using gold (Au) as the material for the source electrode 3, the drain electrode 4 and the gate electrode 6. The insulating layer 5 of each MISFET is formed to have a thickness of 370 Å of silicon dioxide, setting the distance between the source and the drain to be 20 μm, the width of the gate electrode to be 62 μm, and the gate length to be 13 μm.

It is apparent from comparing the figures that the characteristics will not change by each temperature, gaining a mutual conductance (gm) of 3 mS/mm in both temperature, showing no deterioration of characteristics by the rising of temperature.

Figure 12:
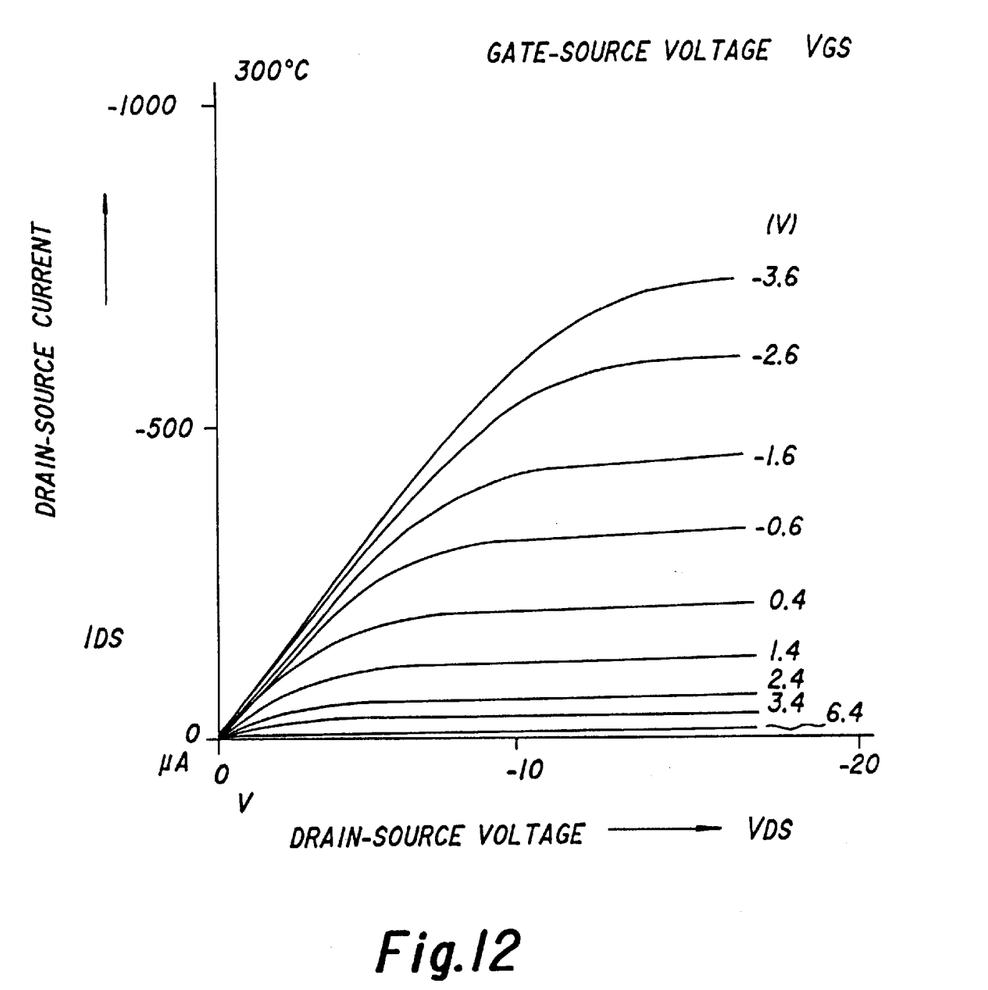
FIG. 12 is an explanatory view of the other characteristics of the hydrogen-terminated diamond MISFET of the present invention.

FIG. 12 shows characteristics of the hydrogen-terminated homoepitaxial diamond MISFET operated at a temperature of 300° C. This MISFET uses gold (Au) as the gate metal, mounting $SiO_x$ of 680 Å as the insulating layer and setting the gate length to 7 μm and the gate width to 62 μm. The mutual conductance as a result was 2.6 mS/mm and operated at the depletion mode.

FIG. 12 puts drain-source voltage (V) on the abscissa, drain-source current (mA) on the ordinate, and takes gate-source voltages (V) as parameters.

Figure 13:
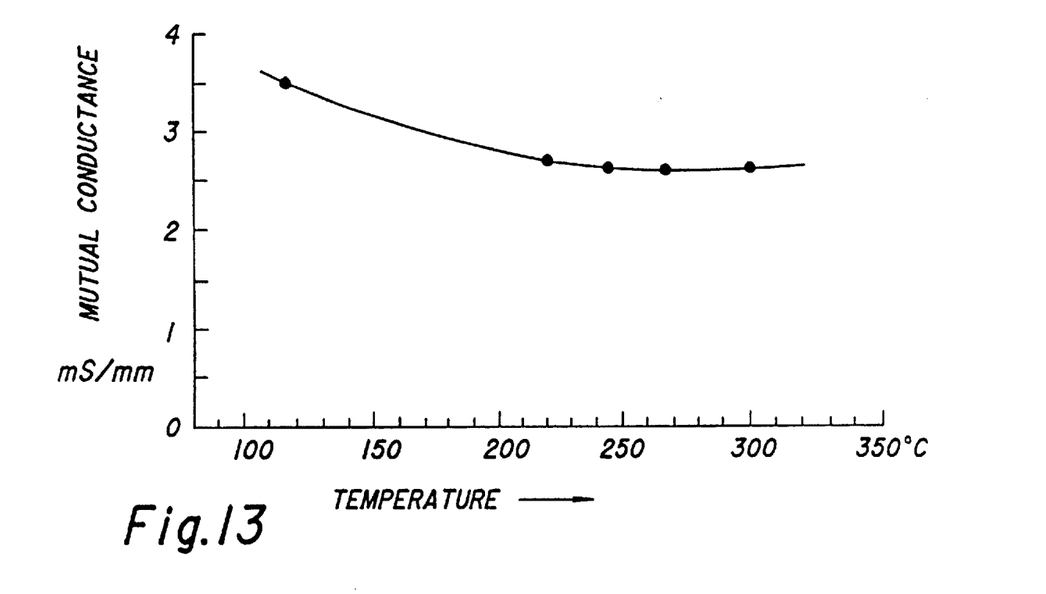
FIG. 13 is an explanatory view of the other characteristics of the hydrogen-terminated diamond MISFET of the present invention.

The temperature dependency of the mutual conductance of the MISFET is shown in FIG. 13. FIG. 13 puts operation temperature (° C.) on the abscissa and mutual conductance (mS/mm) on the ordinate. Being apparent from the figure, the mutual conductance is 3.5 mS/mm at 115° C., but 2.7 mS/mm at 220° C., and becomes 2.6 mS/mm at 245° C., 270° C. and 300° C.

The foregoing embodiments have been explained as using hydrogen-terminated homoepitaxial diamond obtained by microwave plasma CVD; however, other appropriate methods such as hot filament method, radio-frequency hot plasma CVD, d.c. arc plasma CVD, combustion flame method, etc.

are also usable. Moreover, the diamond need not be prepared by homoepitaxial growth; instead, the invention can apparently be applied to any of heteroepitaxial diamond grown by vapor deposition, natural diamond monocrystal, hydrogen-terminated diamond and a diamond monocrystal made by a high-pressure method, prepared by processing in the atmosphere of hydrogen plasma, considering the fundamental of the invention that the p-type semiconductor layer can be made by hydrogen-terminating the surface layer of the diamond.

In lieu of gold, platinum (Pt) could be used as the ohmic contact material. Further, platinum (Pt) could be used in lieu of gold for gate electrode. Further, aluminum (Al), lead (Pb), zinc (Zn), nickel (Ni) making high Schottky barriers, or further copper (Cu), steel (Fe), chromium (Cr) and the like could also be used.

Figure 8A:
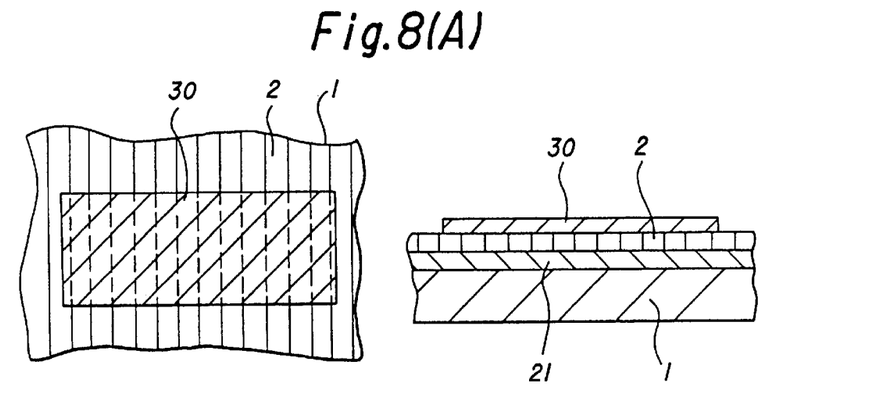
FIGS. 8a–8d is an explanatory view showing the manufacturing process using the self-alignment method of the hydrogen-terminated diamond MISFET of the present invention.
Figure 8B:
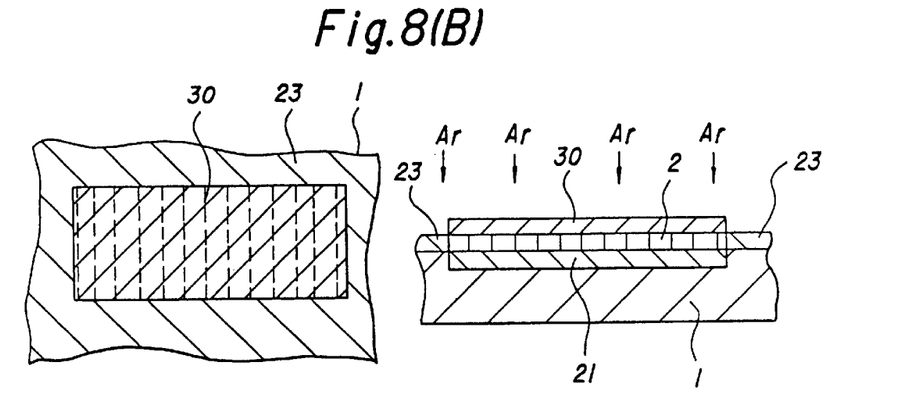
Figure 8C:
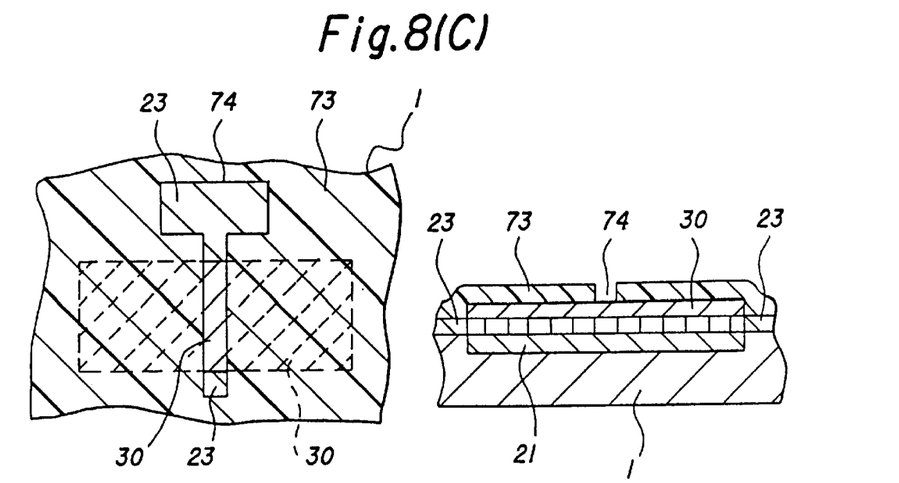
Figure 8D:
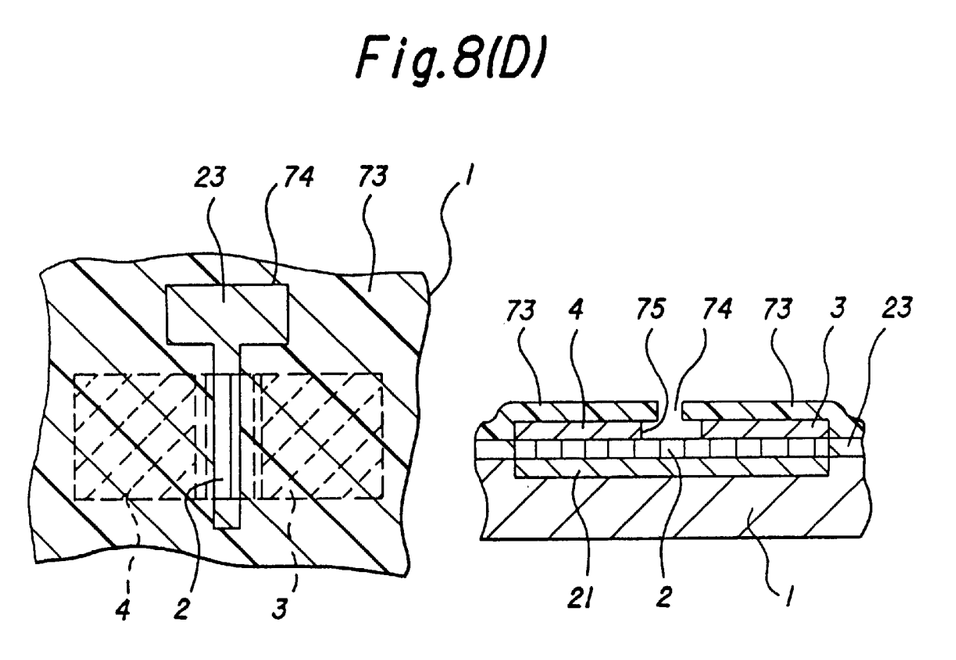
Figure 9A:
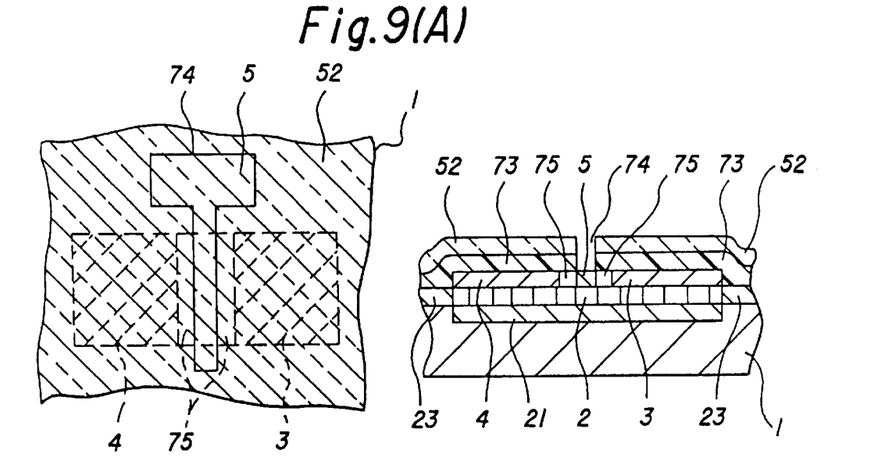
FIGS. 9a–9c is a continuous explanatory view showing the manufacturing process using the self-alignment method of the hydrogen-terminated diamond MISFET of the present invention.
Figure 9B:
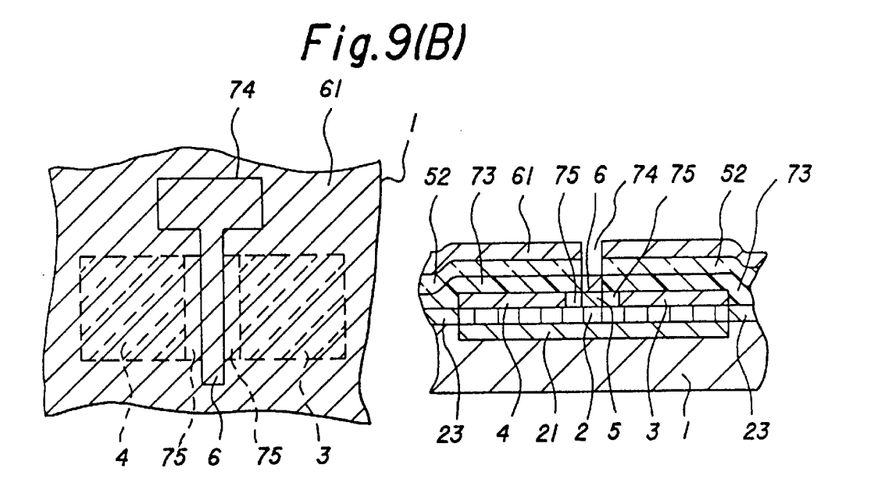
Figure 9C:
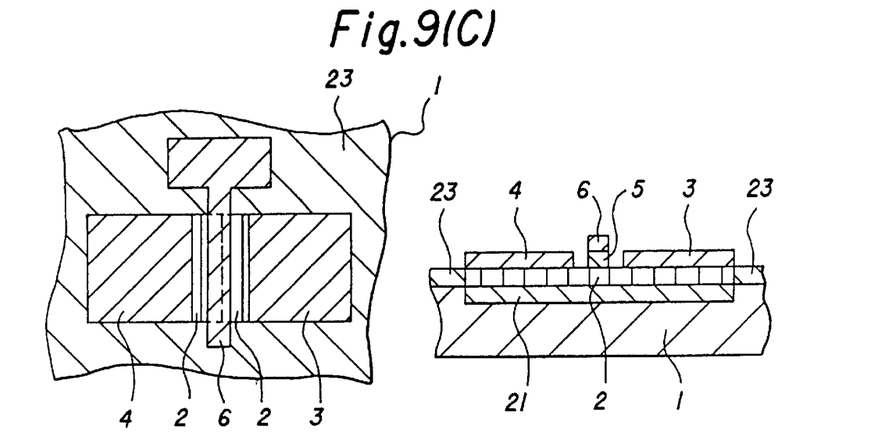

With reference to FIG. 8 and FIG. 9, the second embodiment of the present invention will be explained.

The present invention is related to a method of manufacturing the above-mentioned epitaxial diamond MISFET using a self-matching process. In the drawing, the left figures show a plan view and the right figures show a cross-sectional view.

A diamond substrate is put in a plasma CVD apparatus using microwaves as its exciting source. Introduced into the plasma CVD apparatus is a mixed gas containing hydrogen ($H_2$) and a carbon-supplying gas such as methane ($CH_4$), ethane ($C_2H_6$), butane ($C_4H_{10}$), ethylene ($C_2H_4$), carbon oxide (CO) and carbon dioxide ($CO_2$). The mixed gas is excited into plasma by microwaves, and diamond crystal is epitaxially grown on the surface of the diamond substrate to form a homoepitaxial diamond film 1.

After that, the substrate is rapidly cooled in the presence of hydrogen gas, such that hydrogen atoms bond to dangling bonds of carbon atoms in the surface layer of the diamond crystal to form the hydrogen-terminated surface 2. Thus obtained is a hydrogen-terminated homoepitaxial diamond substrate 1 having a surface conductive layer 21.

Gold, for example, is deposited to the surface of said hydrogen-terminated homoepitaxial diamond substrate 1 by evaporation to form a conductive layer, and then the gold is etched to cover the source region, the drain region and the channel forming region, and a metal layer 30 of gold (Au) and the like which will become a source electrode (ohmic contact) and a drain electrode (ohmic contact) is formed (FIG. 8 (A)).

After the resist is patterned to the region for forming the electrodes to form a mask 71, the surface is irradiated with argon ions to provide damage to the hydrogen-terminated region 2 other than the placed being covered by the source electrode 3, the drain electrode 4 and the resist 71 in order to gain a non-hydrogen-terminated region 23. Under the non-hydrogen-terminated region 23 shows insulating characteristics with the p-type semiconductor layer being extinct (FIG. 8 (B)).

Next, resist having selectivity against potassium iodide (KI) solution is applied and patterned to form a mask 73 having an opening 74 on the region for forming the gate electrode (FIG. 8 (C)). The metal layer 30 and the non-hydrogen-terminated surface 23 is exposed from the opening 74 of the mask 73.

Then, the KI solution is used to etch the metal layer 30 in the opening 74 of the mask 73. This etching is isotropic, so etching is performed not only to the lower portion of the opening 74 of the mask 73, but also to the lower area of the mask 73, forming a cavity 75. Also, isolated source contact 4 and drain contact 5 are formed (FIG. 8 (D)).

Next, the mask 73 is used to form an insulating layer 5 by depositing an insulating material like silicon dioxide by evaporation. In the opening 74, an insulating layer 5 having the same shape as the opening 74 is formed (FIG. 9 (A)).

Then, a gate electrode material 61 such as gold is evaporated and deposited thereto. A gate electrode 6 is formed on the insulating layer 5 inside the opening 74 (FIG. 9 (B)).

After that, the mask 73 is removed, and a diamond MISFET having isolated electrodes comprising a gate electrode 6 being self-matched and positioned on the insulating layer 5 between the source electrode 4 and the drain electrode 3 is formed (FIG. 9 (C)). This MISFET has only one mask to define the relative position of the gate electrode 6 to the source electrode 4 and the gate electrode 3, which increases mutual conductance.

By this method, a plurality of MISFETs having a hydrogen-terminated surface and forming a very thin p-type semiconductor layer under the surface and having elements isolated on the diamond layer will be formed by a self-alignment method. The mutual conductance in a MESFET using lead (Pb) gate electrode is 4.5 mS/mm, and a MESFET gained by a self-alignment method using lead (Pb) gate electrode is 12.3 mS/mm. In contrast, the MISFET formed by the self-alignment method of the present invention is 16.4 mS/mm and is very good.

Next, the third embodiment will be explained. This embodiment uses a polycrystal diamond as the diamond and its surface is flattened by grinding, and then the surface is hydrogen-terminated to gain conductivity, and then a drain, a source and a gate electrode positioned between said drain and said source on an insulating layer is formed on this region to form a hydrogen-terminated polycrystal diamond MISFET.

Further, this embodiment forms the insulating layer of the hydrogen-terminated polycrystal diamond MISFET by a silicon oxide film shown by the chemical formula $SiO_x$ (provided $1 \leq X \leq 2$).

In the first and second embodiments, the MISFET was formed using a hydrogen-terminated epitaxial grown layer (homoepitaxial layer or heteroepitaxial layer). However, regarding the fact that a monocrystal diamond having a large surface suitable for a substrate is difficult to obtain, it is difficult to assemble a large scaled circuit using these inventions.

The present embodiment, therefore, provides a hydrogen-terminated diamond MISFET suited for assembling a large scaled circuit.

This invention uses a polycrystal diamond as the substrate having a large surface area, wherein the surface of the polycrystal diamond is grind-processed for enabling the surface to be hydrogen-terminated. On said ground surface of the polycrystal diamond, a hydrogen-terminated polycrystal diamond region is formed by a hydrogen-termination processing (like in the first and second embodiments), and forming a MISFET on said region.

Figure 14:
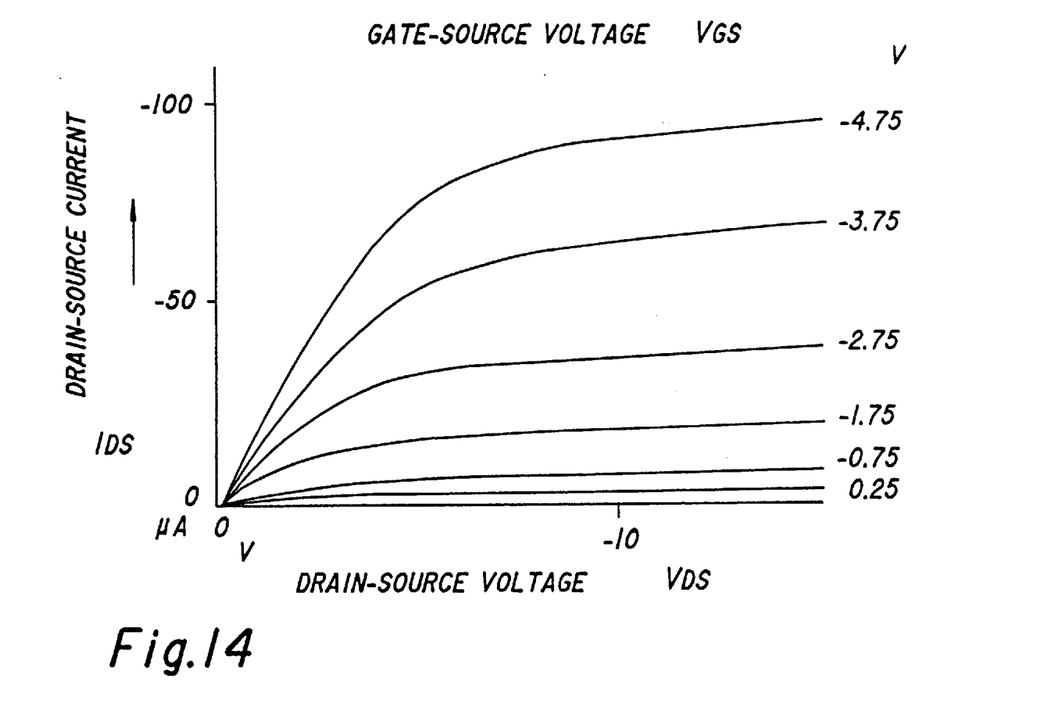
FIG. 14 is an explanatory view of the other characteristics of the hydrogen-terminated polycrystal diamond MISFET of the present invention.

The hydrogen-terminated polycrystal diamond MISFET gained by this invention uses aluminum (Al) as the gate, the gate length being 12 $\mu$m and the gate width being 80 $\mu$m, and using silicon oxide shown by the chemical formula $SiO_x$ (provided $1 \leq X \leq 2$) as the insulating layer. As a result, a clear FET characteristic as shown in FIG. 14 could be gained, wherein the mutual conductance being 0.42 mS/mm and the threshold voltage being 0.25 V (depletion mode).

In the invention using this polycrystal diamond, hydrogen-termination processing could be performed by the same process as the first and second inventions on the ground and flattened polycrystal diamond surface.

Further, the surface of the hydrogen-terminated diamond after performing the hydrogen-termination processing could be non-hydrogen-terminated by applying an oxygen plasma processing Dr by irradiating argon ions as is with the first and second inventions in order to gain an insulated region.

Further, the surface of the polycrystal diamond could be separated to a hydrogen-terminated region and a non-hydrogen-terminated region, and FET could be formed on said terminated region to be isolated from each other.

Also, in the present invention, as is with the first and second inventions, the source or the drain to be formed on the hydrogen processed region is formed under the ohmic contact formed of gold or platinum.

The present inventions enables to manufacture a hydrogen-terminated diamond MISFET by forming an insulating layer on the surface of a hydrogen-terminated diamond without damaging the hydrogen-terminated surface. That is, in the above embodiment of the present invention, SiO is deposited by evaporation onto the hydrogen-terminated surface of the hydrogen-terminated diamond in order to form an insulating layer shown by the chemical formula $SiO_x$ ($1 \leq X \leq 2$).

As the method for forming this kind of insulating layer, not only the evaporation method but also other conventional deposition methods such as sputtering and CVD could also be used. When utilizing these deposition method, it is important not to damage the hydrogen-terminated surface, and insulating materials other than the above ($SiO_x$), such as alumina ($Al_2O_3$), silicon oxide ($Si_3N_4$), silicon oxide nitride (SiON), carborundum (SiC), aluminum nitride (AlN), and amorphous carbon (a-C), could also be used to form the insulating layer.

As described above. By the present invention, a MISFET having a large mutual conductance and operative in a depletion mode could be gained on the surface of a hydrogen-terminated homoepitaxial diamond, and by non-hydrogen-terminating the surface of the diamond between each element, the elements could be isolated by a simple process, therefore enabling formation of a diamond semiconductor device with plurality of MISFETs being integrated.

Further, in the prior art, there was a problem that the leakage current of the MESFET to the gate increased according to the rise in temperature, but by using an insulating layer, the leakage current could be decreased, and the temperature characteristic was improved greatly compared to the prior art diamond MISFETs.

Further, the mutual conductance will not change according to temperature, and the MISFET will operate stably in an environment of around 180° C.

Further, the present invention not only simplifies the process for making a plurality of diamond semiconductor elements on a single substrate but also enables the use of any simple configuration of FET, for example, other than a circular shape is employable, which contributes to a further miniaturization and a higher integration. Further, the present invention includes a step of mounting an insulating layer (for example, $SiO_2$), so the insulating layer could be utilized for integration wiring.

Moreover, since the invention need not introduce an impurity for making the semiconductor layer, the device can be made with safety without using $B_2H_6$ or other toxic gas, and can simplify equipment for fabrication without the need for accounts on such a toxic gas.

The invention can use vapor deposition for making gate electrode, source-ohmic contacts and drain-ohmic contacts, and hence simplifies the manufacturing process.

Further, since FETs according to the invention can be made of diamond having a large band gap, they can be used even under high temperature environment and reliably operate under intensive X rays as well.

In addition to these, since the invention uses a resist as a mask for the non-hydrogen-terminating process, the process could be simplified remarkably, and increases the mutual conductance to a value as high as 3 mS/mm.

Even further, in the present invention using self-alignment method, the insulating gate electrode is FET and a mask for deciding the relative position of the gate electrode to the source electrode, these electrodes could be positioned in a relatively accurate manner, and mutual conductance increases greatly.

We claim:

1. A method for manufacturing an element-isolated hydrogen-terminated diamond MISFET, comprising the steps of:

etching a metal layer formed on a diamond whose surface is hydrogen-terminated to form a source electrode and a drain electrode;

creating a non-hydrogen-terminated region by non-hydrogen-terminating a hydrogen-terminated diamond region left after forming a resist on a region for forming FET electrodes;

forming an insulating layer on a hydrogen-terminated region; and forming a gate electrode on said insulating layer.

2. The method for manufacturing a hydrogen-terminated diamond MISFET of claim 1 wherein said diamond is either a homoepitaxial diamond or a heteroepitaxial diamond.

3. The method for manufacturing a hydrogen-terminated diamond MISFET of claim 1 wherein the diamond is a polycrystal diamond with the surface being flattened.

4. The method for manufacturing a hydrogen-terminated diamond MISFET of claim 1 wherein said insulating layer is a silicon oxide shown by the chemical formula $SiO_x$ (provided $1 \leq X \leq 2$).

5. The method for manufacturing a hydrogen-terminated diamond MISFET of claim 1; wherein said diamond is either a homoepitaxial diamond or a heteroepitaxial diamond; and said insulating layer is a silicon oxide shown by the chemical formula $SiO_x$ (provided $1 \leq X \leq 2$).

6. The method for manufacturing a hydrogen-terminated diamond MISFET of claim 1; wherein the diamond is a polycrystal diamond with the surface being flattened; and said insulating layer is a silicon oxide shown by the chemical formula $SiO_x$ (provided $1 \leq X \leq 2$).

7. The method for manufacturing a hydrogen-terminated MISFET of claim 1, wherein said source electrode or said drain electrode are an ohmic-contact formed of gold or platinum.

8. The method for manufacturing a hydrogen-terminated diamond MISFET of claim 1 wherein:

said diamond is either a homoepitaxial diamond or a heteroepitaxial diamond; and said source electrode or said drain electrode are an ohmic-contact formed of gold or platinum.

9. The method for manufacturing a hydrogen-terminated diamond MISFET of claim 1; wherein the diamond is a polycrystal diamond with the surface being flattened; and said source electrode or said drain electrode are an ohmic-contact formed of gold or platinum.

10. The method for manufacturing a hydrogen-terminated diamond MISFET of claim 1; wherein said insulating layer is a silicon oxide shown by the chemical formula $SiO_x$ (provided $1 \leq X \leq 2$); and said source electrode or said drain electrode are an ohmic-contact formed of gold or platinum.

11. The method for manufacturing a hydrogen-terminated diamond MISFET of claim 1; wherein said diamond is either a homoepitaxial diamond or a heteroepitaxial diamond;

said insulating layer is a silicon oxide shown by the chemical formula $SiO_x$ (provided $1 \leq X \leq 2$); and said source electrode or said drain electrode are an ohmic-contact formed of gold or platinum.

12. The method for manufacturing a hydrogen-terminated diamond MISFET of claim 1; wherein the diamond is a polycrystal diamond with the surface being flattened;

said insulating layer is a silicon oxide shown by the chemical formula $SiO_x$ (provided $1 \leq X \leq 2$); and said source electrode or said drain electrode are an ohmic-contact formed of gold or platinum.

13. The method for manufacturing a hydrogen-terminated diamond MISFET of claim 1; wherein said non-hydrogen-terminated region is formed by either substituting oxygen on the surface of said hydrogen-terminated diamond by oxygen plasma processing, or by irradiating argon ions onto the surface of said hydrogen-terminated diamond.

14. The method for manufacturing a hydrogen-terminated diamond MISFET of claim 1; wherein said diamond is either a homoepitaxial diamond or a heteroepitaxial diamond; and said non-hydrogen-terminated region is formed by either substituting oxygen on the surface of said hydrogen-terminated diamond by oxygen plasma processing, or by irradiating argon ions onto the surface of said hydrogen-terminated diamond.

15. The method for manufacturing a hydrogen-terminated diamond MISFET of claim 1; wherein the diamond is a polycrystal diamond with the surface being flattened; and said non-hydrogen-terminated region is formed by either substituting oxygen on the surface of said hydrogen-terminated diamond by oxygen plasma processing, or by irradiating argon ions onto the surface of said hydrogen-terminated diamond.

16. The method for manufacturing a hydrogen-terminated diamond MISFET of claim 1; wherein said insulating layer is a silicon oxide shown by the chemical formula $SiO_x$ (provided $1 \leq X \leq 2$); and said non-hydrogen-terminated region is formed by either substituting oxygen on the surface of said hydrogen-terminated diamond by oxygen plasma processing, or by irradiating argon ions onto the surface of said hydrogen-terminated diamond.

17. The method for manufacturing a hydrogen-terminated diamond MISFET of claim 1; wherein said diamond is either a homoepitaxial diamond or a heteroepitaxial diamond;

said insulating layer is a silicon oxide shown by the chemical formula $SiO_x$ (provided $1 \leq X \leq 2$); and said non-hydrogen-terminated region is formed by either substituting oxygen on the surface of said hydrogen-terminated diamond by oxygen plasma processing, or by irradiating argon ions onto the surface of said hydrogen-terminated diamond.

18. The method for manufacturing a hydrogen-terminated diamond MISFET of claim 1; wherein the diamond is a polycrystal diamond with the surface being flattened;

said insulating layer is a silicon oxide shown by the chemical formula $SiO_x$ (provided $1 \leq X \leq 2$); and said non-hydrogen-terminated region is formed by either substituting oxygen on the surface of said hydrogen-terminated diamond by oxygen plasma processing, or by irradiating argon ions onto the surface of said hydrogen-terminated diamond.

19. The method for manufacturing a hydrogen-terminated MISFET of claim 1, wherein said source electrode or said drain electrode are an ohmic-contact formed of gold or platinum; and said non-hydrogen-terminated region is formed by either substituting oxygen on the surface of said hydrogen-terminated diamond by oxygen plasma processing, or by irradiating argon ions onto the surface of said hydrogen-terminated diamond.

20. The method for manufacturing a hydrogen-terminated diamond MISFET of claim 1 wherein:

said diamond is either a homoepitaxial diamond or a heteroepitaxial diamond;

said source electrode or said drain electrode are an ohmic-contact formed of gold or platinum; and said non-hydrogen-terminated region is formed by either substituting oxygen on the surface of said hydrogen-terminated diamond by oxygen plasma processing, or by irradiating argon ions onto the surface of said hydrogen-terminated diamond.

21. The method for manufacturing a hydrogen-terminated diamond MISFET of claim 1; wherein the diamond is a polycrystal diamond with the surface being flattened;

said source electrode or said drain electrode are an ohmic-contact formed of gold or platinum; and said non-hydrogen-terminated region is formed by either substituting oxygen on the surface of said hydrogen-terminated diamond by oxygen plasma processing, or by irradiating argon ions onto the surface of said hydrogen-terminated diamond.

22. The method for manufacturing a hydrogen-terminated diamond MISFET of claim 1; wherein said insulating layer is a silicon oxide shown by the chemical formula $SiO_x$ (provided $1 \leq X \leq 2$);

said source electrode or said drain electrode are an ohmic-contact formed of gold or platinum; and said non-hydrogen-terminated region is formed by either substituting oxygen on the surface of said hydrogen-terminated diamond by oxygen plasma processing, or by irradiating argon ions onto the surface of said hydrogen-terminated diamond.

23. The method for manufacturing a hydrogen-terminated diamond MISFET of claim 1; wherein said diamond is either a homoepitaxial diamond or a heteroepitaxial diamond;

said insulating layer is a silicon oxide shown by the chemical formula $SiO_x$ (provided $1 \leq X \leq 2$);

said source electrode or said drain electrode are an ohmic-contact formed of gold or platinum; and said non-hydrogen-terminated region is formed by either substituting oxygen on the surface of said hydrogen-terminated diamond by oxygen plasma processing, or by irradiating argon ions onto the surface of said hydrogen-terminated diamond.

24. The method for manufacturing a hydrogen-terminated diamond MISFET of claim 1; wherein the diamond is a polycrystal diamond with the surface being flattened;

said insulating layer is a silicon oxide shown by the chemical formula $SiO_x$ (provided $1 \leq X \leq 2$);

said source electrode or said drain electrode are an ohmic-contact formed of gold or platinum; and said non-hydrogen-terminated region is formed by either substituting oxygen on the surface of said hydrogen-terminated diamond by oxygen plasma processing, or by irradiating argon ions onto the surface of said hydrogen-terminated diamond.

* * * * *